US010042461B2

(12) United States Patent
Liu et al.

(10) Patent No.: US 10,042,461 B2
(45) Date of Patent: Aug. 7, 2018

(54) ARRAY SUBSTRATE, MANUFACTURING AND DRIVING METHODS THEREOF, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Yingming Liu, Beijing (CN); Xue Dong, Beijing (CN); Haisheng Wang, Beijing (CN); Xiaochuan Chen, Beijing (CN); Xiaoliang Ding, Beijing (CN); Shengji Yang, Beijing (CN); Weijie Zhao, Beijing (CN); Hongjuan Liu, Beijing (CN); Changfeng Li, Beijing (CN); Wei Liu, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/913,790

(22) PCT Filed: Sep. 18, 2015

(86) PCT No.: PCT/CN2015/089998
§ 371 (c)(1),
(2) Date: Feb. 23, 2016

(87) PCT Pub. No.: WO2016/123985
PCT Pub. Date: Aug. 11, 2016

(65) Prior Publication Data
US 2016/0357314 A1    Dec. 8, 2016

(30) Foreign Application Priority Data

Feb. 2, 2015    (CN) .......................... 2015 1 0053731

(51) Int. Cl.
*G06F 3/045*    (2006.01)
*G06F 3/041*    (2006.01)
(Continued)

(52) U.S. Cl.
CPC .......... *G06F 3/0416* (2013.01); *G02F 1/1368* (2013.01); *G02F 1/136227* (2013.01);
(Continued)

(58) Field of Classification Search
None
See application file for complete search history.

(56) References Cited

U.S. PATENT DOCUMENTS 8,884,292 B2    11/2014    Sun et al.
9,046,955 B1 *    6/2015    Lee ...................... G06F 3/0412
(Continued)

FOREIGN PATENT DOCUMENTS

CN    101840084 A    9/2010
CN    102544025 A    7/2012
(Continued)

OTHER PUBLICATIONS

International Search Report of PCT/CN2015/089998 in Chinese, dated Dec. 17, 2015 with English translation.
(Continued)

*Primary Examiner* — Stephen T Reed
(74) *Attorney, Agent, or Firm* — Collard & Roe, P.C.

(57) ABSTRACT

An array substrate, manufacturing and driving methods thereof, and a display device are provided. The array substrate includes a base substrate and a plurality of gate lines and a plurality of data lines disposed on the base substrate. A plurality of pixel units distributed in an array are defined by the gate lines and the data lines; each pixel unit includes a common electrode, a pixel electrode and a thin-film transistor (TFT); a first insulating layer is disposed on one
(Continued)

side of a layer provided with the common electrodes away from the base substrate; and a plurality of self-capacitance electrodes are disposed on one side of the first insulating layer away from the base substrate.

14 Claims, 5 Drawing Sheets

(51) Int. Cl.
  *G02F 1/1362* (2006.01)
  *G02F 1/1368* (2006.01)
  *G06F 3/044* (2006.01)
  *H01L 27/12* (2006.01)

(52) U.S. Cl.
  CPC ........ *G02F 1/136286* (2013.01); *G06F 3/044* (2013.01); *G06F 3/045* (2013.01); *G06F 3/0412* (2013.01); *H01L 27/124* (2013.01); *H01L 27/1255* (2013.01); *G06F 2203/04103* (2013.01); *G06F 2203/04111* (2013.01)

(56) References Cited

U.S. PATENT DOCUMENTS

| | | | |
|---|---|---|---|
| 9,519,374 | B2 | 12/2016 | Liu et al. |
| 2002/0036724 | A1 | 3/2002 | Ha |
| 2012/0268396 | A1* | 10/2012 | Kim ............... G06F 3/0412 345/173 |
| 2014/0225838 | A1* | 8/2014 | Gupta ............. G06F 3/0412 345/173 |
| 2014/0320761 | A1* | 10/2014 | Misaki ............. G06F 3/044 349/12 |
| 2014/0362029 | A1 | 12/2014 | Mo et al. |
| 2015/0177880 | A1* | 6/2015 | Shin ............... G06F 3/0412 345/174 |
| 2015/0293636 | A1* | 10/2015 | Park ............... G06F 3/0418 345/174 |
| 2016/0048241 | A1 | 2/2016 | Zhao et al. |
| 2016/0246408 | A1 | 8/2016 | Wang et al. |

FOREIGN PATENT DOCUMENTS

| | | |
|---|---|---|
| CN | 103294322 A | 9/2013 |
| CN | 103744245 A | 4/2014 |
| CN | 103941488 A | 7/2014 |
| CN | 104020891 A | 9/2014 |
| CN | 104020892 A | 9/2014 |
| CN | 104020893 A | 9/2014 |
| CN | 104571715 A | 4/2015 |

OTHER PUBLICATIONS

Notice of Transmittal of the International Search Report of PCT/CN2015/089998 in Chinese, dated Dec. 17, 2015.
Written Opinion of the International Searching Authority of PCT/CN2015/089998 in Chinese, dated Dec. 17, 2015 with English translation.
Chinese Office Action in Chinese Application No. 201510053731.7, dated Mar. 27, 2017 with English translation.
Second Chinese Office Action in Chinese Application No. 201510053731.7, dated Jul. 24, 2017 with English translation.

\* cited by examiner

ARRAY SUBSTRATE, MANUFACTURING AND DRIVING METHODS THEREOF, AND DISPLAY DEVICE

CROSS REFERENCE TO RELATED APPLICATIONS

This application is the National Stage of PCT/CN2015/089998 filed on Sep. 18, 2015, which claims priority under 35 U.S.C. § 119 of Chinese Application No. 201510053731.7 filed on Feb. 2, 2015, the disclosure of which is incorporated by reference.

TECHNICAL FIELD

At least one embodiment of the present disclosure relates to an array substrate, a manufacturing method and a driving method thereof, and a display device.

BACKGROUND

Along with the rapid development of display technology, touch panels have been widely applied in people's life. At present commonly used touch panels are liquid crystal touch panels which mainly comprise a touch structure for achieving touch function and a liquid crystal display (LCD) panel for achieving display function.

The LCD panel includes an array substrate and an opposing substrate (e.g., a color filter (CF) substrate) which are arranged opposite to each other, and a liquid crystal layer disposed between the array substrate and the opposing substrate. An LCD device controls the deflection of liquid crystal molecules by applying voltages to common electrodes and pixel electrodes, and hence controls light transmission. In view of different display modes, the common electrodes and the pixel electrodes may be respectively disposed on the opposing substrate and the array substrate (e.g., twisted nematic (TN) mode), or may be both disposed on the array substrate (e.g., in-plane switching (IPS) mode and advanced super dimension switch (ADS) mode).

The touch panel, for instance, includes an add-on mode touch panel, in which a touch structure and a protective glass sheet on the outside of a display panel are integrated together, and an in-cell touch panel, in which a touch structure is embedded in a display panel. The add-on mode touch panel has the defects such as high manufacturing cost, low light transmittance, thick module, etc. The in-cell touch panel can reduce the overall thickness of a touch module and reduce the manufacturing cost of the touch panel, and hence is favored by various panel manufacturers.

Currently, most touch panels are capacitive touch panels which are divided into touch panels utilizing the mutual-capacitance principle and touch panels utilizing the self-capacitance principle.

As for the touch panel utilizing the mutual-capacitance principle, transverse electrodes and longitudinal electrodes are manufactured on a surface of a substrate, and capacitance will be produced at the intercrossed positions of the transverse electrodes and the longitudinal electrodes. When a screen is touched by a touch object (e.g., a human finger), the coupling of two electrodes near the touch position is affected, so that the capacitance between the two electrodes can be changed, and hence the coordinates of the touch position can be calculated according to the variation of the capacitance.

The touch panel utilizing the self-capacitance principle generally comprises a plurality of self-capacitance electrodes arranged in the same layer and insulated from each other. Each self-capacitance electrode is connected to a touch detection chip through a lead. When a screen is not touched by a touch object (e.g., a human finger), the capacitance of the self-capacitance electrode is at a fixed value; when the screen is touched by the touch object, the capacitance of the self-capacitance electrode corresponding to the touch position is at a value of the fixed value plus the capacitance caused by the touch object, and the coordinates of the touch position can be obtained when the touch detection chip detects the variation of the capacitance value of the self-capacitance electrodes.

SUMMARY

At least one embodiment of the present disclosure provides an array substrate, manufacturing and driving methods thereof, and a display device. Compared with the case that the mutual-capacitance technology is adopted, the embodiment of the present disclosure can reduce the manufacturing processes and improve the signal-to-noise ratio (SNR).

At least one embodiment of the present disclosure provides an array substrate, which comprises a base substrate and a plurality of gate lines and a plurality of data lines disposed on the base substrate, wherein a plurality of pixel units distributed in an array are defined by the gate lines and the data lines; each pixel unit includes a common electrode, a pixel electrode and a thin-film transistor (TFT); a first insulating layer is disposed on one side of a layer provided with the common electrodes away from the base substrate; and a plurality of self-capacitance electrodes are disposed on one side of the first insulating layer away from the base substrate.

At least one embodiment of the present disclosure further provides a display device, which comprises any foregoing array substrate.

At least one embodiment of the present disclosure provides a method for manufacturing an array substrate. The method comprises: forming a plurality of gate lines, a plurality of data lines, thin film transistors (TFTs), common electrodes and pixel electrodes on a base substrate; forming a first insulating layer on one side of the common electrode away from the base substrate by one patterning process; and forming a plurality of self-capacitance electrodes on one side of the first insulating layer away from the base substrate by one patterning process. In the method, a plurality of pixel units distributed in an array is defined by the gate lines and the data lines; and each pixel unit includes a TFT, a common electrode and a pixel electrode.

At least one embodiment of the present disclosure further provides a method for driving the array substrate. The method comprises: applying common electrode signals to common electrodes, and meanwhile applying driving signals to self-capacitance electrodes; and receiving feedback signals of the self-capacitance electrodes, and determining a touch position according to the feedback signals. Or the method comprises: dividing the time for displaying one frame into display period and touch period; applying common electrode signals to the common electrodes in the display period and the touch period; and in the touch period, applying driving signals to the self-capacitance electrodes, receiving feedback signals of the self-capacitance electrodes, and determining the touch position according to the feedback signals. In the method, both the common electrodes and the self-capacitance electrodes are disposed on the base substrate of the array substrate; a first insulating layer is disposed on one side of a layer provided with the common electrodes away from the base substrate; and the self-capacitance electrodes are disposed on one side of the first insulating layer away from the base substrate.

BRIEF DESCRIPTION OF THE DRAWINGS

Simple description will be given below to the accompanying drawings of the embodiments to provide a more clear understanding of the technical proposals of the embodiments of the present disclosure. Obviously, the drawings described below only involve some embodiments of the present disclosure but are not intended to limit the present disclosure.

DETAILED DESCRIPTION

Figure 1:
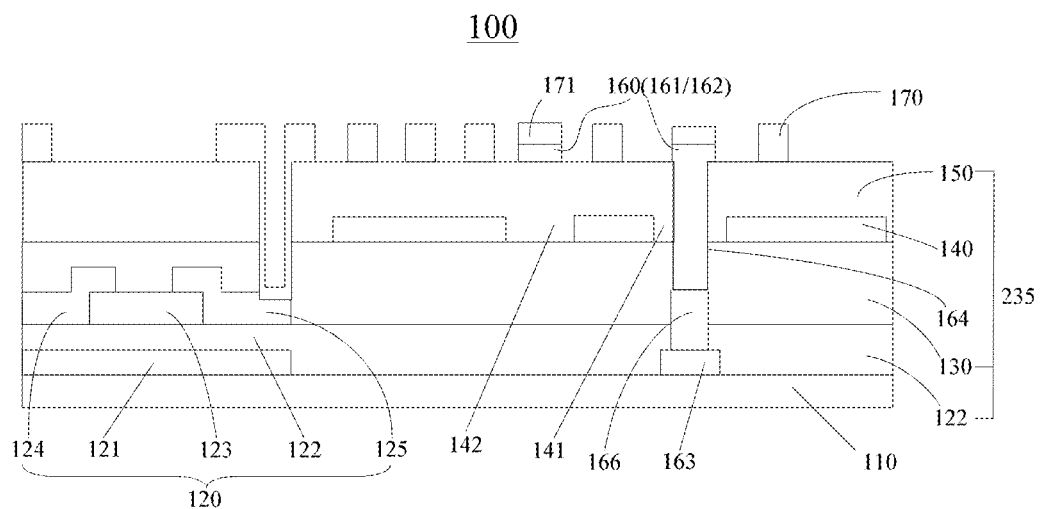
FIG. 1 is a schematic sectional view of an array substrate provided by an embodiment of the present disclosure.

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. Obviously, the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

Unless otherwise defined, the technical terms or scientific terms used in the disclosure have normal meanings understood by those skilled in the art. The words "first", "second" and the like used in the disclosure do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

The inventors of the present application have noted in study that: as for an in-cell touch panel, when a touch structure is manufactured on an array substrate and the mutual-capacitance technology is adopted, at least two patterning processes should be added, and the manufactured touch panel has low SNR. In the self-capacitance technology, because a touch object is directly coupled with a self-capacitance electrode when a screen is touched by the touch object (e.g., a finger), the produced touch variation is large and the SNR is high. Moreover, in the self-capacitance technology, the self-capacitance electrodes are formed by only one patterning process. Therefore, the self-capacitance technology can reduce the amount of manufacturing processes and improve the SNR compared with the mutual-capacitance technology, and hence is more favorable to the in-cell touch panel.

At least one embodiment of the present disclosure provides an array substrate, manufacturing and driving methods thereof, and a display device. Common electrodes and a plurality of self-capacitance electrodes are formed on a base substrate of the array substrate, and the common electrodes are disposed between the base substrate and a layer in which the self-capacitance electrodes are provided. Thus, the manufacturing processes can be reduced and the SNR can be improved.

Figure 2:
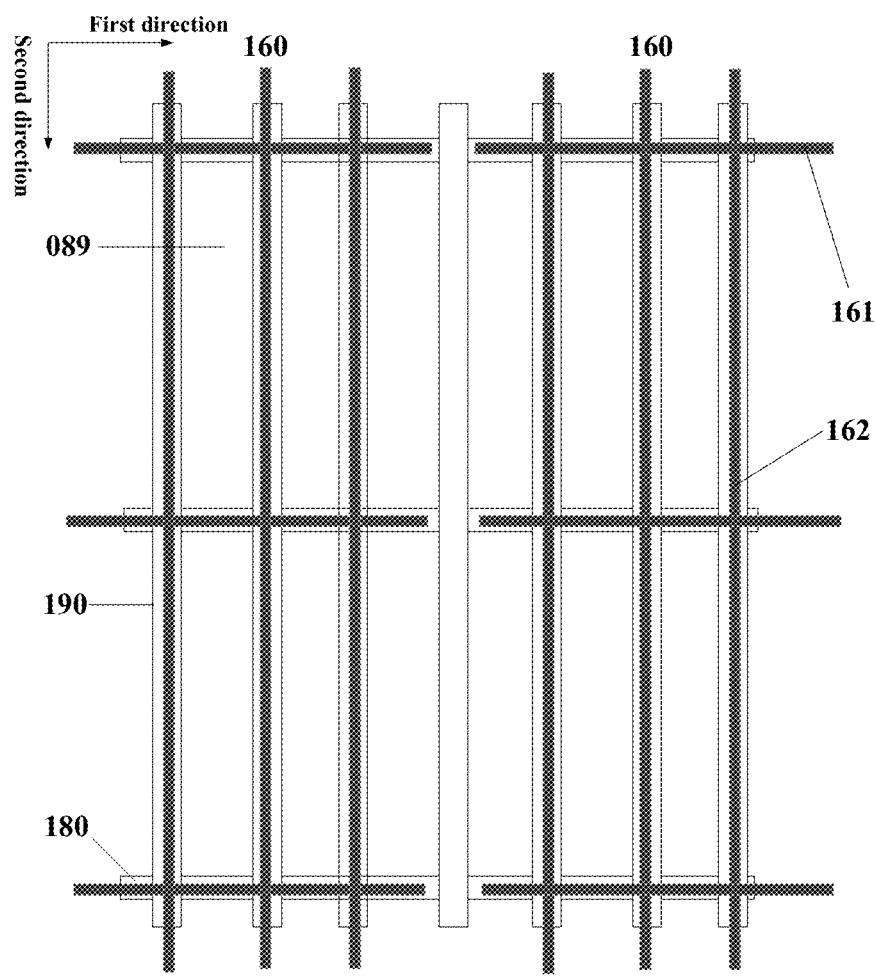
FIG. 2 is a schematic top view of an array substrate provided by an embodiment of the present disclosure.

At least one embodiment of the present disclosure provides an array substrate. As illustrated in FIGS. 1 and 2, the array substrate 100 comprises a base substrate 110 and a plurality of gate lines 180 and a plurality of data lines 190 disposed on the base substrate 110; a plurality of pixel units 089 that are distributed in an array are defined by the gate lines 180 and the data lines 190; each pixel unit 089 includes a common electrode 140, a pixel electrode 170 and a thin film transistor (TFT) 120; a first insulating layer 150 is disposed on one side, away from the base substrate 110, of a layer in which the common electrodes 140 are provided; and a plurality of self-capacitance electrodes 160 are disposed on one side, away from the base substrate 110, of the first insulating layer 150.

In the embodiment of the present disclosure, for instance, the base substrate 110 may be a glass substrate, a quartz substrate, etc.

In the embodiment of the present disclosure, the common electrodes 140 and the pixel electrodes 170 are made from transparent conductive materials, for instance, may be made from transparent metal oxide such as indium tin oxide (ITO), indium zinc oxide (IZO) or indium gallium zinc oxide (IGZO). The common electrodes 140 may be plate electrodes and disposed below the slit pixel electrodes 170 (namely closer to the base substrate 110). Or the common electrodes 140 may also be slit electrodes and disposed above the plate pixel electrodes 170. Description is given in connection with FIG. 1 by taking the case that the common electrodes 140 are plate electrodes and disposed below the slit pixel electrodes 170 as an example.

In the embodiment of the present disclosure, the first insulating layer 150 is configured to allow the common electrodes 140 and the self-capacitance electrodes 160 to be insulated from each other, and for instance, may be made from an insulating material such as silicon oxide, silicon oxynitride, silicon nitride or resin.

In at least one embodiment, the self-capacitance electrodes 160 may be disposed between the layer provided with the common electrodes 140 and a layer provided with the pixel electrodes 170; or the self-capacitance electrodes 160 may be disposed on one side of the layer provided with the pixel electrodes 170, which side is away from the base substrate 110; or the self-capacitance electrodes 160 and the pixel electrodes 170 may be arranged side by side on the same layer. That is to say, the self-capacitance electrodes 160 may be disposed on or beneath the pixel electrodes 170 or arranged in the same layer as the pixel electrodes 170. Description is given in connection with FIG. 1 by taking the case that the self-capacitance electrodes 160 are disposed at gaps between the pixel electrodes 170 and arranged side by side on the first insulating layer 150 with the pixel electrodes 170 as an example.

In at least one embodiment, a protection layer may be disposed on the self-capacitance electrodes 160 when the self-capacitance electrodes 160 are disposed on one side, away from the base substrate 110, of the layer provided with the pixel electrodes 170 or when the self-capacitance electrodes 160 and the pixel electrodes 170 are arranged side by side on the same layer.

For instance, as illustrated in FIG. 1, when the self-capacitance electrodes 160 and the pixel electrodes 170 are arranged side by side on the first insulating layer 150, a protection layer 171 is disposed on the self-capacitance electrodes 160. For instance, the protection layer 171 may be made from a transparent metal oxide material so as to prevent oxidation of the self-capacitance electrodes 160. For instance, after the self-capacitance electrodes 160 are formed from a metallic conductive material, one layer of a transparent metal oxide material may be formed on the self-capacitance electrodes 160, and subsequently, the pixel electrodes 170 and the protection layer 171 disposed on the self-capacitance electrodes 160 are formed by one patterning process (e.g., including the steps such as exposure, development, etching and so on). That is to say, the protection layer 171 may be arranged in the same layer as the pixel electrodes 170, so that the manufacturing process of independently forming the protection layer 171 can be saved. For instance, when the self-capacitance electrodes 160 are disposed on the layer provided with the pixel electrodes 170, an insulating layer (e.g., may be made from an insulating material such as silicon nitride) may be disposed on the self-capacitance electrodes 160 to protect the self-capacitance electrodes 160.

In at least one embodiment, each self-capacitance electrode 160 may be designed to have a latticed or cruciform structure, etc. Thus, the size (area) of the self-capacitance electrodes can be reduced as much as possible, and hence the influence of the self-capacitance electrodes 160 on electric fields between the common electrodes 140 and the pixel electrodes 170 can be reduced and the aperture ratio can be improved. For instance, as illustrated in FIG. 2, each self-capacitance electrode 160 may include at least one first extension 161 extending along a first direction and/or at least one second extension 162 extending along a second direction, and the first direction is intercrossed with the second direction. FIG. 2 illustrates two latticed self-capacitance electrodes 160, namely in this example, the self-capacitance electrode 160 includes a plurality of first extensions and a plurality of second extensions. For instance, when the self-capacitance electrode adopts a cruciform, L-shaped or T-shaped structure, the self-capacitance electrode may include one first extension and one second extension.

It should be noted that the reference sign "160" in FIG. 1 may refer to the first extension 161 or the second extension 162 of the self-capacitance electrode 160 adopting the latticed or cruciform structure, etc.

In at least one embodiment, when the self-capacitance electrode 160 adopts the latticed or cruciform structure or the like, the self-capacitance electrode 160 may be made from a metallic material (e.g., a metal or metal alloy material such as aluminum, copper, zirconium or molybdenum), so that the resistance of the self-capacitance electrode 160 can be reduced.

In at least one embodiment, in order to reduce the influence of the self-capacitance electrodes 160 on the aperture ratio and the display effect as much as possible, particularly when the self-capacitance electrodes 160 are made from a metallic material, the first extensions 161 may be overlapped with gate lines 180 in the direction perpendicular to the base substrate 110, and the second extensions 162 may be overlapped with data lines 190 in the direction perpendicular to the base substrate 110, as shown in FIG. 2. After the array substrate and the opposing substrate (e.g., the CF substrate) are cell-assembled, the data lines and the gate lines correspond to positions of black matrixes on the opposing substrate, and the first extensions and the second extensions correspond to the gate lines and the data lines respectively, so that the first extensions and the second extensions also correspond to the positions of the black matrixes and hence cannot be easily noted by users. Thus, the display effect cannot be affected and the aperture ratio cannot be affected as well.

In order to lead out the signal of a self-capacitance electrode, each self-capacitance electrode may be electrically connected with one lead. In at least one embodiment, the self-capacitance electrodes and the leads may be arranged in the same layer or in different layers. Detailed description will be given with reference to the arrangement of the leads of the self-capacitance electrodes with reference to the accompanying drawings.

Figure 3:
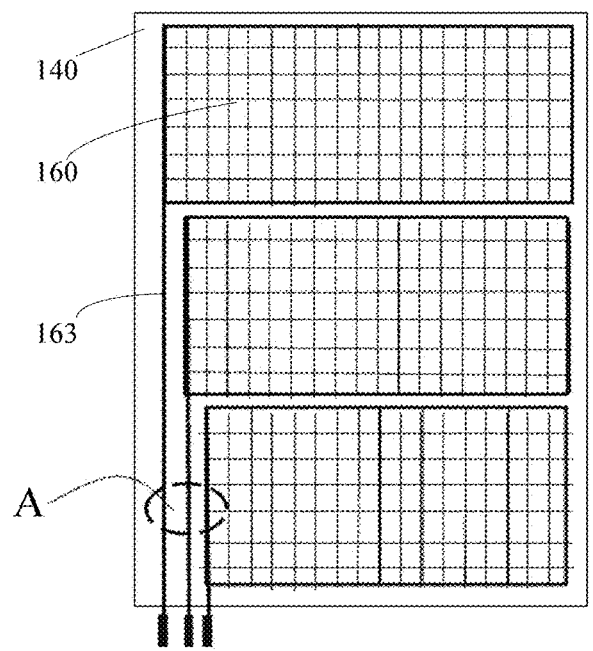
FIG. 3 is a schematic top view of the structure provided by an embodiment of the present disclosure, in which self-capacitance electrodes and leads are arranged in the same layer.

FIG. 3 is a schematic top view of the array substrate provided by an embodiment of the present disclosure, in which the self-capacitance electrodes and the leads are arranged in the same layer. In FIG. 3, each self-capacitance electrode 160 and the lead 163 corresponding to it are arranged above the same layer provided with the common electrodes 140 (the first insulating layer 150 is not shown in FIG. 3). As the self-capacitance electrodes 160 and the leads 163 are arranged in the same layer, blind touch areas tend to present at positions with concentrated leads 163 (e.g., an area A). Signals in the blind touch areas are disordered, so that the touch performance cannot be guaranteed. The mode in which the self-capacitance electrodes and the leads are arranged in the same layer may be applied to products with high resolution. As the pixel size of this type of products is small, the blind touch areas can be adjusted to be within a receivable range. In addition, this mode may also be applied to products with high pixels per inch (PPI).

FIG. 1 illustrates the mode in which the self-capacitance electrodes and the leads are arranged in different layers. As illustrated in FIG. 1, a second insulating layer 236 is disposed between the leads 163 and the layer in which the self-capacitance electrodes 160 are provided, and the self-capacitance electrodes 160 are electrically connected with the leads 163 via through holes 164. In the embodiment of the present disclosure, the self-capacitance electrodes and the leads are arranged in different layers, so that the blind touch area(s) can be avoided.

Figure 4:
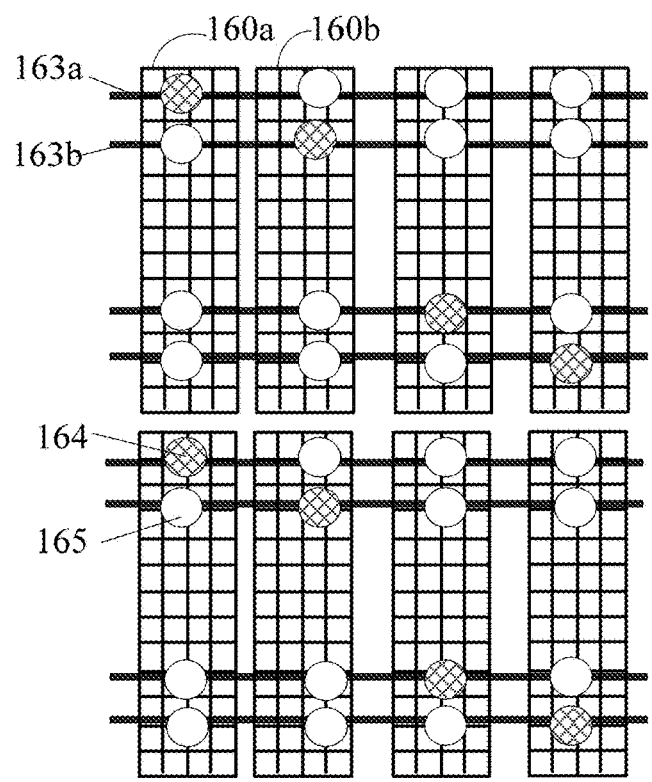
FIG. 4 is a schematic top view of the structure provided by an embodiment of the present disclosure, in which self-capacitance electrodes and leads are arranged in different layers.

FIG. 4 is a schematic top view of the array substrate provided by an embodiment of the present disclosure, in which the self-capacitance electrodes and the leads are arranged in different layers. As illustrated in FIG. 4, a self-capacitance electrode may be overlapped with at least one lead electrically connected with other self-capacitance electrode(s). Description is given in connection with FIG. 4 by taking the case that each self-capacitance electrode is overlapped with two leads (one is the lead of the self-capacitance electrode and the other is a lead of another self-capacitance electrode) as an example. As seen from FIG. 4, the through holes 164 are not uniformly distributed. Due to the diffraction of light, the through holes 164 may be noted by users, and hence the display effect can be affected.

In order to reduce the influence of non-uniform distribution of the through holes on the display effect, in at least one embodiment, a recess may be formed in the second insulating layer between each self-capacitance electrode and at least one lead electrically connected with other self-capacitance electrodes and overlapped with the self-capacitance electrode, and the depth of the recess is less than the thickness of the second insulating layer (namely no through hole is formed). FIG. 4 illustrates 8 self-capacitance electrodes. For instance, a self-capacitance electrode 160a is overlapped with a lead 163a electrically connected with the self-capacitance electrode 160a and is also overlapped with a lead 163b of a self-capacitance electrode 160b; the self-capacitance electrode 160a is electrically connected with the lead 163a via a through hole 164; a recess 165 is formed between the self-capacitance electrode 160a and the lead 163b; and other self-capacitance electrodes in FIG. 4 are also arranged in similar mode. As seen from FIG. 4, the through holes 164 and the recesses 165 are uniformly distributed throughout the layer, so that the consistency of display can be improved and the influence of non-uniform distribution of the through holes on the display effect can be reduced.

When a self-capacitance electrode and a lead electrically connected therewith are arranged in different layers, the lead may be disposed on one side of the self-capacitance electrode, which side is away from the base substrate (namely above the self-capacitance electrode 160 in FIG. 1) or may be disposed on one side of the self-capacitance electrode, which side faces the base substrate (namely below the self-capacitance electrode 160 in FIG. 1). The self-capacitance electrode may make direct contact with the lead electrically connected with it and or may be electrically connected with the lead via other conductive structure as shown in FIG. 1. Description is given in the following embodiment by taking the case as shown in FIG. 1 as an example.

For instance, as illustrated in FIG. 1, the lead 163 is disposed below the self-capacitance electrode 160. In this case, the common electrode 140 is provided with an opening 141 at a position corresponding to the through hole 164; and the through hole 164 runs through the opening 141, and the opening 141 is, for instance, a closed opening or a semi-closed opening. A second insulating layer 235 between the self-capacitances 160 and the leads 163 includes the first insulating layer 150 between the self-capacitance electrodes 160 and the common electrodes 140.

In the embodiment of the present disclosure, the leads electrically connected with the self-capacitance electrodes may be made from the material of any one metallic structure on the array substrate. For instance, the leads 163 may be arranged in the same layer as the first electrodes of the TFTs 120, so that the leads can be manufactured by the materials for forming the first electrodes. For instance, the first electrode may be a gate electrode 121, a source electrode 124 or a drain electrode 125 of the TFT 120. For instance, the gate electrode and the source/drain electrode may be made from a metallic material such as aluminum, copper, zirconium or molybdenum.

For instance, the self-capacitance electrodes 160 and the leads 163 may be electrically connected with each other via conducting blocks 166. With provision of the conducting blocks 166, the problem that the leads 163 are broken in the process of forming the through holes 164 due to the over-etching of the second insulating layer 235 can be avoided, so that the self-capacitance electrodes 160 and the leads 163 can be better electrically connected. For instance, the conducting blocks 166 may be arranged in the same layer as second electrodes of the TFT 120. For instance, as illustrated in FIG. 1, the second electrodes may be source electrodes 124 and drain electrodes 125, so that the conducting blocks 166 and the source electrodes 124 and the drain electrodes 125 of the TFTs can be simultaneously formed in the same patterning process (e.g., including the steps such as exposure, development, etching and so on).

It should be noted that description is given in connection with FIG. 1 by only taking the case that the TFT 120 is a bottom-gate TFT as an example. But the TFT may also be a top-gate TFT. In this example, the gate electrode 121 and a gate insulating layer 122 may be disposed above the source electrode 124 and the drain electrode 125. In this case, the lead 163 may be arranged in the same layer as the source electrode and the drain electrode disposed on the lower layer, and the conducting block 166 may be arranged in the same layer as the gate electrode disposed on the upper layer.

In order to reduce the power consumption of the array substrate, a thick insulating layer may be disposed beneath the common electrodes 140 to reduce the capacitance between the common electrodes 140 and metallic structures (e.g., gate lines and data lines) disposed beneath the common electrodes 140. For instance, as illustrated in FIG. 1, a third insulating layer 130 is disposed between the layer provided with the common electrodes 140 and the TFT 120. For instance, the third insulating layer may be made from a resin material. For instance, the thickness of the third insulating layer may be 2-3 μm. When the third insulating layer 130 is provided, the second insulating layer 235 between the self-capacitance electrodes 160 and the leads 163 further includes the third insulating layer 130.

In addition, the recesses 165 formed in the second insulating layer 235 may be formed in the third insulating layer 130. This because the third insulating layer 130 may be set to be thick, and the provision of the recesses 165 in the insulating layer can effectively solve the problem of non-uniform display caused by non-uniform distribution of the through holes 164. In order to further solve the problem of non-uniform display, the common electrode 140 may be further provided with an opening at a position corresponding to the recess 165.

As illustrated in FIG. 1, the TFT 120 includes a gate insulating layer 122. When the lead 163 and the electrode(s) of the TFT 120 disposed on the lower layer (e.g., the gate electrode of the bottom-gate TFT or the source electrode and the drain electrode of the top-gate TFT) are arranged in the same layer, the second insulating layer 235 between the self-capacitance electrodes 160 and the leads 163 further includes the gate insulating layer 122 (e.g., may be made from an insulating material such as silicon nitride).

In at least one embodiment, the common electrode 140 may be provided with a hollowed-out area 142 at a position corresponding to one part of or all the first extensions 161 and the second extensions 162 of each self-capacitance electrode 140. Thus, the ground capacitance of the self-capacitance electrode 160 can be reduced, and hence the self-capacitance electrode 160 can be more likely to be driven. For instance, as for the self-capacitance electrode 160 adopting the latticed structure, the common electrode 140 may be provided with the hollowed-out area at a position corresponding to one part of the first extensions 161 and the second extensions 162 of the self-capacitance electrode 160. For instance, as for the self-capacitance electrode 160 adopting the cruciform structure, the common electrode 140 may be provided with the hollowed-out area at a position corresponding to all the first extensions and the second extensions of the self-capacitance electrode 160.

In addition, after the common electrodes are hollowed-out, parasitic capacitance may be produced between the self-capacitance electrodes 160 and the gate lines 180 and the data lines 190. In order to reduce the parasitic capacitance, an insulating layer may be disposed between the self-capacitance electrodes 160 and the gate lines 180 and/or the data lines 190. For instance, the capacitance between the self-capacitance electrodes 160 and the gate lines 180 and the data lines 190 respectively can be reduced by utilization of the third insulating layer 130 between the TFTs 120 and the layer provided with the common electrodes 140.

Figure 5:
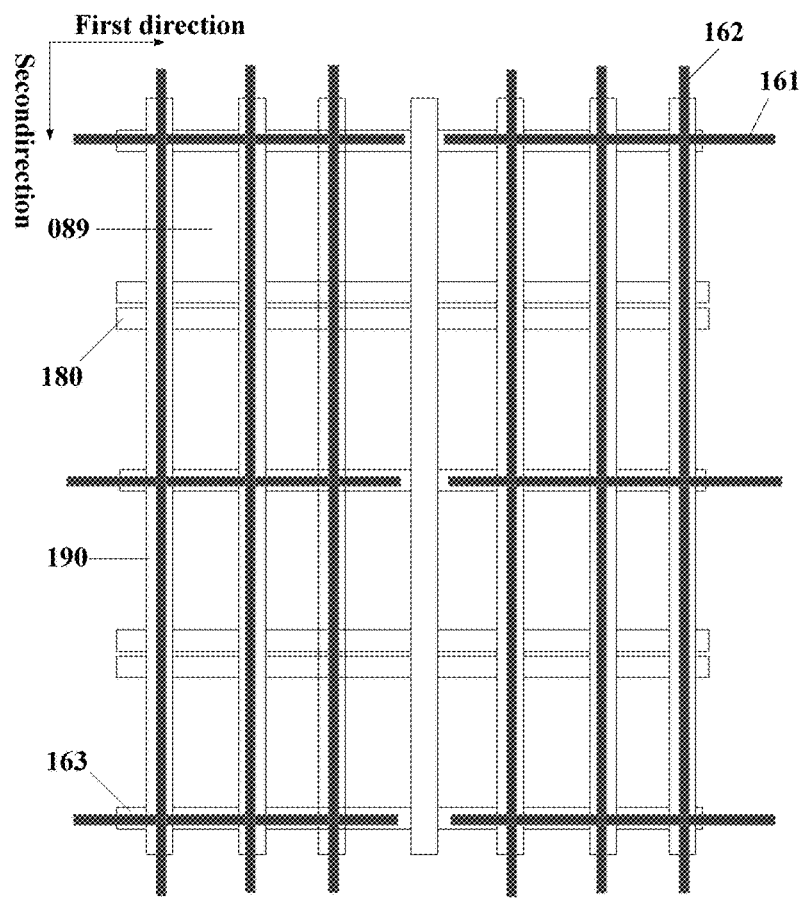
FIG. 5 is a schematic top view of an array substrate provided by an embodiment of the present disclosure.

In at least one embodiment, as illustrated in FIG. 5, a pixel unit group is formed by every two adjacent rows of pixel units 089; two gate lines 180 are disposed between the two adjacent rows of pixel units 089; and the leads 163 may be disposed at gaps between adjacent pixel unit groups.

In general, in the array substrate, the gate lines and the gate electrodes of the TFTs are arranged in the same layer (e.g., both are integrally formed), and the data lines and the source electrodes and the drain electrodes of the TFTs are arranged in the same layer (e.g., a data line and one of a source electrode and a drain electrode are integrally formed). Therefore, in the case as shown in FIG. 1, the leads 163, the gate electrodes 121 and the gate lines may be arranged in the same layer and formed in the same patterning process, and the conducting blocks 166, the source electrodes 124, the drain electrodes 125 and the data lines may be arranged in the same layer and formed in the same patterning process. In addition, common electrode lines which provide signals for the common electrodes may also be arranged in the same layer and formed in the same patterning process as the leads 163, the gate electrodes 121 and the gate lines.

It should be noted that: in the case as shown in FIG. 1, the second insulating layer 235 between the self-capacitance electrodes 160 and the leads 163 includes the first insulating layer 150, the third insulating layer 130 and the gate insulating layer 122. But the embodiments of the present disclosure are not limited thereto. For instance, the second insulating layer 235 may further include the first insulating layer 150 and the third insulating layer 130 and does not include the gate insulating layer 122. For instance, the array substrate 100 may also be not provided with the third insulating layer 130. Correspondingly, the second insulating layer 235 may not include the third insulating layer 130.

At least one embodiment of the present disclosure further provides a method for manufacturing an array substrate. As illustrated in FIGS. 1 and 2, the method comprises: forming a plurality of gate lines 180, a plurality of data lines 190, TFTs 120, common electrodes 140 and pixel electrodes 170 on a base substrate 110; forming a first insulating layer 150 on one side of the common electrode 140 away from the base substrate 110 by one patterning process; and forming a plurality of self-capacitance electrodes 160 on one side of the first insulating layer 150 away from the base substrate 110 by one patterning process. In the method, a plurality of pixel units 089 distributed in an array are defined by the gate lines 180 and the data lines 190; and each pixel unit 089 includes a TFT 120, a common electrode 140 and a pixel electrode 170.

The patterning process includes the processes of forming a certain pattern via a mask plate, for instance, includes the steps of photoresist coating, photoresist exposing, photoresist developing, etching of a thin film layer via a photoresist pattern, etc. But the embodiments are not limited thereto. The patterning process may also be other processes of forming the pattern without the mask plate, for instance, may form the pattern via a screen printing process.

In the embodiment of the present disclosure, the self-capacitance electrodes 160 are formed after the common electrodes 140 are formed. Thus, in the formed array substrate, the common electrodes 140 are disposed between the base substrate 110 and the layer provided with the self-capacitance electrodes 160. Compared with the mutual-capacitance technology, the array substrate provided by the embodiment of the present disclosure can form the self-capacitance electrodes by adding one patterning process, and hence not only can reduce the manufacturing process but also can improve the SNR.

In the embodiment of the present disclosure, the forming sequence of the self-capacitance electrodes 160 and the pixel electrodes 170 is not limited. For instance, the pixel electrodes 170 may be formed before or after the plurality of self-capacitance electrodes 160 are formed.

When the pixel electrodes 170 are formed before the self-capacitance electrodes 140 are formed, as the self-capacitance electrodes 160 are disposed above the upper layer of the pixel electrodes 170, a protection layer 171 may be formed on the self-capacitance electrodes 160. For instance, transparent conductive material may be formed on one side of the self-capacitance electrode away from the base substrate; and a protection layer is formed on each self-capacitance electrode, at the same time when the pixel electrodes are formed, by one patterning process.

In at least one embodiment, the self-capacitance electrode may adopt the latticed or cruciform structure or the like to reduce the influence on the electric fields between the common electrodes and the pixel electrodes. For instance, as illustrated in FIG. 2, each formed self-capacitance electrode 160 includes at least one first extension 161 extending along a first direction and/or at least one second extension 162 extending along a second direction, and the first direction is intercrossed with the second direction.

In at least one embodiment, in order to reduce the ground capacitance of the self-capacitance electrodes, the common electrode 140 may be provided with a hollowed-out area at a position corresponding to one part of or all the first extensions 161 and the second extensions 162 of each self-capacitance electrode 160, at the same time when the common electrode 140 is formed, by one patterning process.

In at least one embodiment, the self-capacitance electrodes and the leads electrically connected therewith may be arranged in the same layer or in different layers. For instance, when the self-capacitance electrodes and the leads are arranged in the same layer, the plurality of leads may be formed at the same time when the plurality of self-capacitance electrodes are formed, so that each self-capacitance electrode is electrically connected with one lead. For instance, when the self-capacitance electrodes and the leads are arranged in different layers, as illustrated in FIG. 1, the plurality of leads 163 and the second insulating layer 235 may be formed in sequence on the base substrate 110 before the common electrodes 140 are formed, so that each self-capacitance electrode 160 is electrically connected with the lead 163 via the through hole 164 in the second insulating layer 235.

In at least one embodiment, in order to reduce non-uniform display caused by non-uniform distribution of the through holes 164, as illustrated in FIG. 4, the manufacturing method may comprise: in the process of forming the self-capacitance electrodes 140, allowing each self-capacitance electrode 140 to be overlapped with at least one lead electrically connected with other self-capacitance electrode(s); and in the process of forming the second insulating layer, forming at least one recess 165 in the second insulating layer. The at least one recess 165 corresponds to each self-capacitance electrode and the at least one lead electrically connected with other self-capacitance electrode(s) and overlapped with the self-capacitance electrode, and the depth of the recess 165 is less than the thickness of the second insulating layer (namely the recess 165 is not the through hole running through the second insulating layer).

In the embodiment of the present disclosure, when the self-capacitance electrodes and the leads are arranged in different layers, the leads may be disposed above or below the self-capacitance electrodes. When the leads are disposed below the self-capacitance electrodes, in at least one embodiment, as illustrated in FIG. 1, the manufacturing method comprises: forming openings 141 corresponding to the through holes 164 in the common electrodes 140 at the same time when the common electrodes 140 are formed.

In the embodiment of the present disclosure, the leads electrically connected with the self-capacitance electrodes may be made from the material for forming any metallic structure on the array substrate. For instance, the manufacturing method may comprise: forming first electrodes (e.g., gate electrodes 121 or source electrodes 124 and drain electrodes 125) of the TFTs 120 and a plurality of leads 163.

In the embodiment of the present disclosure, the self-capacitance electrodes 160 and the leads 163 may make direct contact or may be electrically connected with each other through conducting blocks 166. For instance, when the self-capacitance electrodes 160 and the leads 163 are electrically connected with each other through the conducting blocks 166, the manufacturing method comprises: forming second electrodes of the TFTs and the conducting blocks 166 through which the self-capacitance electrodes 160 and the leads 163 are electrically connected by one patterning process. For instance, when the TFT 120 is a bottom-gate TFT, the second electrodes may be a source electrode 124 and a drain electrode 125. For instance, when the TFT 120 is a top-gate TFT, the second electrode may be a gate electrode.

Detailed description will be given below to the method for manufacturing the array substrate provided by the embodiment of the present disclosure by taking the array substrate as shown in FIG. 1 as an example.

As illustrated in FIG. 1, the common electrodes 140 in the array substrate 100 are plate electrodes; the pixel electrodes 170 are slit electrodes; the self-capacitance electrodes 160 and the pixel electrodes 170 are arranged side by side on the first insulating layer 150; the TFT 120 is a bottom-gate TFT; and the self-capacitance electrodes 160 are electrically connected with the leads 163 via the conducting blocks 166. In this case, the method for manufacturing the array substrate provided by the embodiment of the present disclosure may comprise the following steps S1 to S9. The steps will be described below one by one.

Figure 6A:
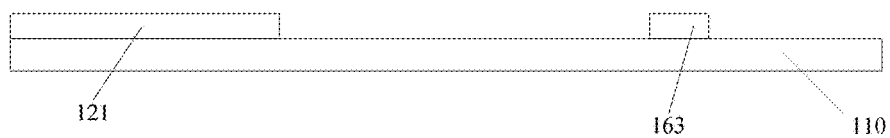
FIGS. 6a to 6h are schematic sectional views of an array substrate obtained after various steps of the method for manufacturing the array substrate, provided by an embodiment of the present disclosure.

S1: as illustrated in FIG. 6a, forming a gate metal layer on a base substrate 110, and forming leads 163, gate electrodes 121 and gate lines (not shown in FIG. 6a) by first patterning process.

For instance, the base substrate 110 may be a glass substrate, a quartz substrate or the like, and the gate metal layer may be made from metal such as aluminum, copper, zirconium or molybdenum. In addition, common electrode lines or the like may also be formed in the step. No further description will be given here.

Figure 6B:
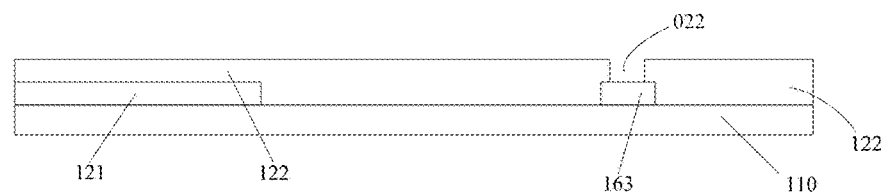

S2: forming a gate insulating layer material, forming a gate insulating layer 122 by second patterning process, and forming gate insulating layer through holes 022 at positions of the gate insulating layer 122 corresponding to the leads 163 so as to expose the leads 163, as show in FIG. 6b.

Figure 6C:

S3: forming an active layer material, forming an active layer 123 by third patterning process, and etching the active layer material in the gate insulating layer through holes 022 to expose the leads 163, as shown in FIG. 6c.

Figure 6D:
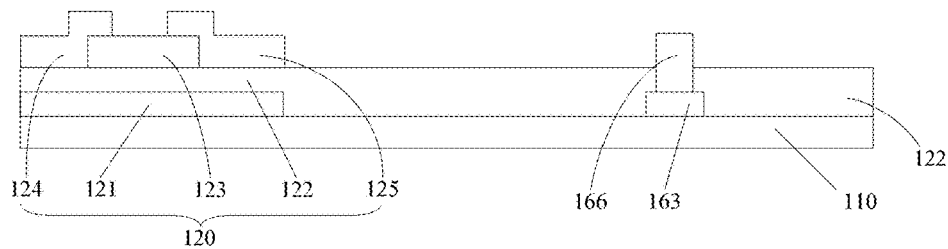

S4: as illustrated in FIG. 6d, forming a source/drain metal layer, forming source electrodes 124, drain electrodes 125, data lines (not shown in FIG. 6d) and conducting blocks 166 disposed in the gate insulating layer through holes 022 by fourth pattering process, and allowing the conducting blocks 166 to make contact with the leads 163.

Figure 6E:
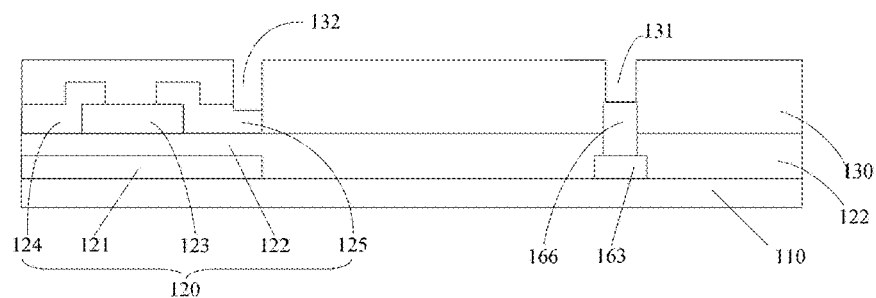

S5: forming a third insulating layer material, forming a third insulating layer 130 by fifth patterning process, forming through holes 131 at positions corresponding to the conducting blocks 166 to expose the conducting blocks 166, and forming through holes 132 at positions corresponding to the drain electrodes 125 to expose the drain electrodes 125, as shown in FIG. 6e.

In the step, a recess (not shown in FIG. 6e) may also be formed in the third insulating layer 130. The recess is overlapped with one lead along the direction to the base substrate 110.

Figure 6F:
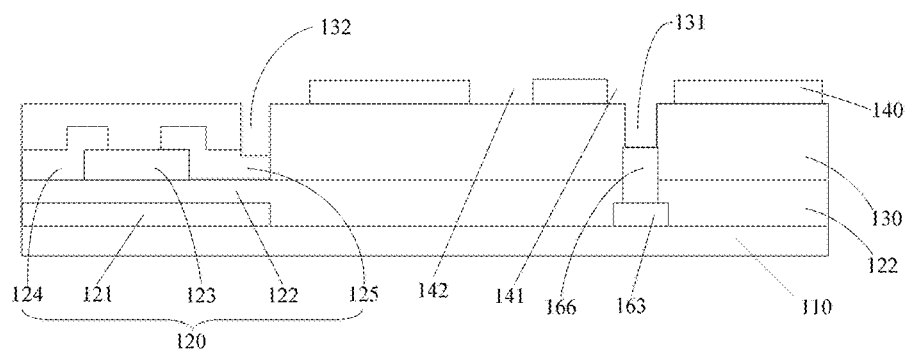

S6: forming a first transparent conductive material, and forming common electrodes 140 by sixth patterning process, as shown in FIG. 6f. In the step, the common electrodes 140 are provided with openings 141 at positions corresponding to the conducting blocks 166; the first transparent conductive material in the through holes 131 are etched to expose the conducting blocks 166; the common electrode 140 is provided with a hollowed-out area 142 at a position corresponding to one part of or all the first extensions and the second extensions of each self-capacitance electrode to be formed; the common electrodes 140 are provided with openings at positions corresponding to the drain electrodes 125; and the first transparent conductive materials in the through holes 132 are etched to expose the drain electrodes 125.

In the step, if the recesses are formed in the step S5, the common electrodes may also be provided with openings at positions corresponding to the recesses.

Figure 6G:
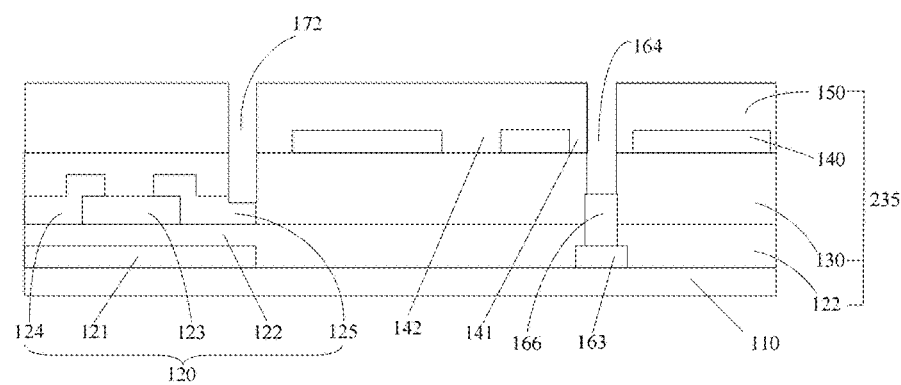

S7: forming a first insulating layer material, forming a first insulating layer by seventh patterning process, forming through holes 164 at positions corresponding to the conducting blocks 166 to expose the conducting blocks 166, and forming through holes 172 at positions corresponding to the drain electrodes 125 to expose the drain electrodes 125, as shown in FIG. 6g.

Figure 6H:
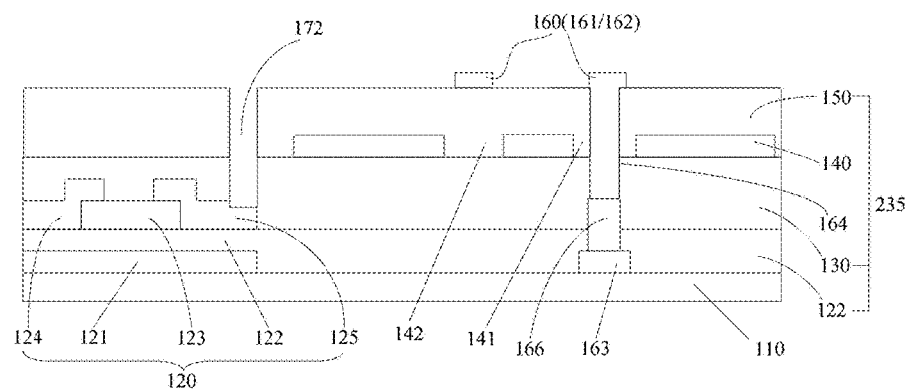

S8: forming one layer of metallic material, forming self-capacitance electrodes 160 by eighth patterning process, allowing each self-capacitance electrode 160 to include at least one first extension 161 and at least one second extension 162, allowing one extension of each self-capacitance electrode 160 to be electrically connected with the conducting block 166, allowing at least one extension to correspond to the hollowed-out area 142 in the common electrode 140, and etching the metallic material in the through holes 172 to expose the drain electrodes 125, as shown in FIG. 6h.

In the step, if the recesses are formed in the step S5, the self-capacitance electrodes 160 are formed at positions corresponding to the recesses. In the step, the metallic material in the through holes 172 may also be retained.

S9: forming a second transparent conductive material, forming pixel electrodes 170 by ninth patterning process, allowing the pixel electrodes 170 to make contact with the drain electrodes 125, and forming a protection layer 171 by retaining the second transparent conductive material which covers the self-capacitance electrodes 160, as shown in FIG. 1.

In the step, if the metallic material in the through holes 172 is not etched in the step S8, the pixel electrodes 170 may make contact with the metallic materials in the through holes 172 to achieve the electrical connection between the pixel electrodes 170 and the drain electrodes 125.

It should be noted that the above manufacturing method is obtained by adding one mask process for forming the self-capacitance electrodes on the basis of the array substrate adopting eight mask processes (namely patterning processes). The manufacturing method provided by the embodiment of the present disclosure may also be applicable to other array substrates, e.g., array substrates adopting seven mask processes or six mask processes. No further description will be given here.

In the manufacturing method, the arrangement of the structures may refer to the relevant description of the embodiments of the array substrate. No further description will be given here.

At least one embodiment of the present disclosure further provides a method for driving the array substrate provided by any foregoing embodiment. The driving method comprises: applying common electrode signals to the common electrodes, and meanwhile, applying driving signals to the self-capacitance electrodes; receiving feedback signals of the self-capacitance electrodes, and determining the touch position according to the feedback signals (hereafter referred to as first mode); or dividing the time for displaying one frame into display period and touch period, applying common electrode signals to the common electrodes in the display period and the touch period, and in the touch period, applying driving signals to the self-capacitance electrodes, receiving feedback signals of the self-capacitance electrodes, and determining the touch position according to the feedback signals (hereafter referred to as second mode). In the driving method, as illustrated in FIG. 1, both the common electrodes 140 and the self-capacitance electrodes 160 are disposed on the base substrate 110 of the array substrate 100; a first insulating layer 150 is disposed on one side of the layer provided with the common electrodes 140 away from the base substrate 110; and self-capacitance electrodes 160 are disposed on one side of the first insulating layer 150 away from the base substrate. The implementation of the array substrate in the driving method may refer to the embodiments of the array substrate. No further description will be given here.

The driving method provided by the embodiment of the present disclosure provides two driving modes: in the first mode, display driving and touch driving are respectively conducted and do not affect each other, so display driving may be continually conducted and touch driving may also be continually conducted; in the second mode, time-sharing driving is adopted, and the time for displaying one frame is divided into display period and touch period; and display driving may be continually conducted in the display period and the touch period, and touch driving can be only conducted in the touch period. Therefore, in the driving method provided by the embodiment of the present disclosure, the display function is not affected by the touch function.

In the embodiment of the present disclosure, in the process of display driving, the driving method further comprises: applying gate scanning signals to gate lines, and applying gray-scale signals to data lines.

For instance, when the second mode is adopted, the driving method may comprise: in the display period, applying gate scanning signals to the plurality of gate lines, applying gray-scale signals to the plurality of data signal lines, and applying common electrode signals to the common electrodes, so as to achieve the LCD function, in which the self-capacitance electrodes are grounded; and in the touch period, applying driving signals to the self-capacitance electrodes, receiving the feedback signals of the self-capacitance electrodes, and determining whether touch has occurred by analyzing the feedback signals, so as to achieve the touch function. Moreover, in the process, the signals of the gate lines, the data lines and the common electrodes are consistent with those in the display period to achieve the LCD function. In the example, in the display period, common electrode signals may also be applied to the self-capacitance electrodes.

When the first mode is adopted, the implementation of the LCD function and the implementation of the touch function are similar to those of the second mode. The difference is that, in the first mode, the display period and the touch period are not required to be divided and display driving and touch driving can be conducted simultaneously.

In addition, in the process of achieving the touch function, the driving signals may be applied to the self-capacitance electrodes in sequence, and the feedback signals of the self-capacitance electrodes may be received in sequence. The driving signals may also be applied to the self-capacitance electrodes at the same time, and the feedback signals of the self-capacitance electrodes of the self-capacitance electrodes may be received at the same time.

Figure 7:
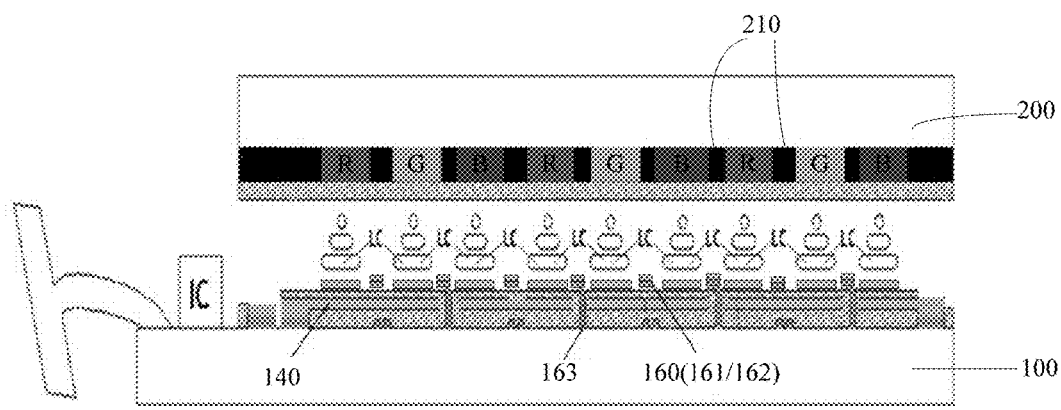
FIG. 7 is a schematic sectional view of a display device provided by an embodiment of the present disclosure.

At least one embodiment of the present disclosure further provides a display device, which comprises the array substrate 100 provided by any foregoing embodiment. As illustrated in FIG. 7, the self-capacitance electrodes 160 on the array substrate 100 are disposed on the common electrodes 140. Description is given in connection with FIG. 7 by taking the case that the self-capacitance electrodes 160 and the leads 163 are arranged in different layers as an example. The implementation of the array substrate may refer to the above relevant description. No further description will be given here.

The display device provided by the embodiment of the present disclosure may be: any product or component with display function such as an LCD panel, e-paper, a mobile phone, a tablet PC, a TV, a display, a notebook computer, a digital picture frame and a navigator.

In at least one embodiment, as illustrated in FIG. 7, the display device further comprises an opposing substrate 200 arranged opposite to the array substrate 100. The opposing substrate 200 is provided with black matrixes 210. When each self-capacitance electrode 160 includes at least one first extension extending along a first direction and/or at least one second extension extending along a second direction and the first direction is intercrossed with the second direction, the first extensions 161 and the second extensions 162 correspond to positions of the black matrixes. That is to say, when each self-capacitance electrode 160 adopts the latticed or cruciform structure or the like, the self-capacitance electrodes 160 correspond to the positions of the black matrixes 210. As the black matrixes are made from a black light-shielding material, the self-capacitance electrodes 160 (particularly when the self-capacitance electrodes are made from a metallic material) are shielded by the black matrixes and hence cannot affect the display effect.

Of course, liquid crystals are also disposed between the array substrate 100 and the opposing substrate 200; structures such as a color filter layer, a planarization layer and spacers may also be disposed on the opposing substrate 200; and structures such as a touch integrated chip (IC) and a printed circuit board (PCB) may also disposed on the array substrate 100. As the structures are well-known by those skilled in the art, no further description will be given here.

The foregoing is only the preferred embodiments of the present disclosure and not intended to limit the scope of protection of the present disclosure. The scope of protection of the present disclosure should be defined by the appended claims.

The application claims priority to the Chinese patent application No. 201510053731.7, filed on Feb. 2, 2015, the disclosure of which is incorporated herein by reference as part of the application.

The invention claimed is:

1. An array substrate, comprising a base substrate and a plurality of gate lines and a plurality of data lines disposed on the base substrate, wherein
a plurality of pixel units distributed in an array is defined by the gate lines and the data lines;
each pixel unit includes a common electrode, a pixel electrode and a thin-film transistor (TFT);
a first insulating layer is disposed on one side, away from the base substrate, of a layer provided with the common electrodes; and
a plurality of self-capacitance electrodes is disposed on one side, away from the base substrate, of the first insulating layer,
wherein each self-capacitance electrode includes at least one first extension extending along a first direction and at least one second extension extending along a second direction, and the first direction is intercrossed with the second direction;
wherein each first extension is overlapped with and lies within one gate line in a direction perpendicular to the base substrate;
wherein the array substrate further comprises a protection layer disposed on the self-capacitance electrodes, and the protection layer and the pixel electrode are arranged in a same layer and formed with a same material;
wherein each self-capacitance electrode is electrically connected with a lead which is configured to lead out a signal of the self-capacitance electrode, the self-capacitance electrode and the lead are arranged in different layers, a second insulating layer is disposed between a layer provided with the self-capacitance electrode and the lead, and the self-capacitance electrode is electrically connected with the lead via a through hole; and
wherein the array substrate further comprises a conducting block that is disposed on the lead and electrically connected to the lead, the self-capacitance electrode and the lead are electrically connected with each other through the through hole and the conducting block, the TFT includes a first electrode and a second electrode, and the lead and the first electrode are arranged in a same first layer while the conducting block and the second electrode are arranged in a same second layer.

2. The array substrate according to claim 1, wherein the self-capacitance electrodes are disposed between a layer provided with common electrodes and a layer provided with pixel electrodes; or the self-capacitance electrodes are disposed on one side, away from the base substrate, of the layer provided with the pixel electrodes.

3. The array substrate according to claim 2, wherein the protection layer is disposed on the self-capacitance electrodes in a case where the self-capacitance electrodes are disposed on one side, away from the base substrate, of the layer provided with the pixel electrodes or where the self-capacitance electrodes and the pixel electrodes are arranged side by side on the same layer.

4. The array substrate according to claim 1, wherein each second extension is overlapped with and lies within one data line in the direction perpendicular to the base substrate.

5. The array substrate according to claim 1, wherein the common electrode is provided with a hollowed-out area at a position corresponding to one part of or all the first extension and the second extension of each self-capacitance electrode.

6. The array substrate according to claim 1, wherein the self-capacitance electrode is overlapped with at least one lead electrically connected with other self-capacitance electrode; a recess is formed in the second insulating layer between the self-capacitance electrode and the lead; and the depth of the recess is less than the thickness of the second insulating layer.

7. The array substrate according to claim 1, wherein the common electrode is provided with an opening at a position corresponding to the through hole; and the through hole runs through the opening.

8. The array substrate according to claim 7, wherein a third insulating layer is disposed between the layer provided with the common electrode and the TFT, the TFT includes a gate insulating layer, and the second insulating layer further includes the third insulating layer and the gate insulating layer.

9. The array substrate according to claim 7, wherein a pixel unit group is defined by every two adjacent rows of pixel units; two gate lines are disposed between the two adjacent rows of pixel units; and the leads are disposed at gaps between adjacent pixel unit groups.

10. The array substrate according to claim 1, wherein a third insulating layer is disposed between the TFT and the layer provided with the common electrode.

11. A display device, comprising the array substrate according to claim 1.

12. The display device according to claim 11, further comprising:
an opposing substrate arranged opposite to the array substrate,
wherein the opposing substrate is provided with black matrixes, and the first extension and the second extension correspond to positions of the black matrixes in a case where each self-capacitance electrode includes at least one first extension extending along a first direction and/or at least one second extension extending along a second direction, and the first direction is intercrossed with the second direction.

13. A method for manufacturing an array substrate, comprising:
forming a plurality of gate lines, a plurality of data lines, thin film transistors (TFTs), common electrodes, and pixel electrodes on a base substrate;
forming a first insulating layer on one side, away from the base substrate, of the common electrode by one patterning process; and
forming a plurality of self-capacitance electrodes on one side, away from the base substrate, of the first insulating layer by one patterning process, wherein a plurality of pixel units distributed in an array is defined by the gate lines and the data lines and each pixel unit includes a TFT, a common electrode and a pixel electrode, wherein each self-capacitance electrode includes at least one first extension extending along a first direction and at least one second extension extending along a second direction, and the first direction is intercrossed with the second direction;

wherein each first extension is overlapped with and lies within one gate line in a direction perpendicular to the base substrate; and wherein a protection layer is disposed on the self-capacitance electrodes, and the protection layer and the pixel electrode are arranged in a same layer and formed with a same material;

wherein each self-capacitance electrode is electrically connected with a lead which is configured to lead out a signal of the self-capacitance electrode, the self-capacitance electrode and the lead are arranged in different layers, a second insulating layer is disposed between a layer provided with the self-capacitance electrode and the lead, and the self-capacitance electrode is electrically connected with the lead via a through hole; and wherein the array substrate further comprises a conducting block that is disposed on the lead and electrically connected to the lead, the self-capacitance electrode and the lead are electrically connected with each other through the through hole and the conducting block, the TFT includes a first electrode and a second electrode, and the lead and the first electrode are arranged in a same first layer while the conducting block and the second electrode are arranged in a same second layer.

14. A method for driving an array substrate, comprising:

applying common electrode signals to common electrodes, and applying driving signals to self-capacitance electrodes, receiving feedback signals of the self-capacitance electrodes, and determining a touch position according to the feedback signals; or dividing time for displaying one frame into a display period and a touch period, applying common electrode signals to the common electrodes in the display period and the touch period, and in the touch period, applying driving signals to the self-capacitance electrodes, receiving feedback signals of the self-capacitance electrodes, and determining the touch position according to the feedback signals;

wherein both the common electrodes and the self-capacitance electrodes are disposed on the base substrate of the array substrate, a first insulating layer is disposed on one side, away from the base substrate, of the layer provided with the common electrodes, and the self-capacitance electrodes are disposed on one side, away from the base substrate, of the first insulating layer;

wherein each self-capacitance electrode includes at least one first extension extending along a first direction and at least one second extension extending along a second direction, and the first direction is intercrossed with the second direction;

wherein each first extension is overlapped with and lies within one gate line in a direction perpendicular to the base substrate;

wherein the array substrate further comprises a protection layer disposed on the self-capacitance electrodes, and the protection layer and the pixel electrode are arranged in a same layer and formed with a same material;

wherein each self-capacitance electrode is electrically connected with a lead which is configured to lead out a signal of the self-capacitance electrode, the self-capacitance electrode and the lead are arranged in different layers, a second insulating layer is disposed between a layer provided with the self-capacitance electrode and the lead, and the self-capacitance electrode is electrically connected with the lead via a through hole; and wherein the array substrate further comprises a conducting block that is disposed on the lead and electrically connected to the lead, the self-capacitance electrode and the lead are electrically connected with each other through the through hole and the conducting block, the TFT includes a first electrode and a second electrode, and the lead and the first electrode are arranged in a same first layer while the conducting block and the second electrode are arranged in a same second layer.

* * * * *